United States Patent [19]
Watanabe et al.

[11] Patent Number: 5,159,483
[45] Date of Patent: Oct. 27, 1992

[54] PROJECTING AND EXPOSING DEVICE

[75] Inventors: Toshiyuki Watanabe, Neyagawa; Masaki Suzuki, Hirakata, both of Japan

[73] Assignee: Matsushita Electric Industrial Co., Ltd., Osaka, Japan

[21] Appl. No.: 621,427

[22] Filed: Dec. 5, 1990

[30] Foreign Application Priority Data
Dec. 7, 1989 [JP] Japan .................................. 1-318028

[51] Int. Cl.⁵ .............................................. G02B 26/10
[52] U.S. Cl. ...................................... 359/210; 359/821
[58] Field of Search ............... 359/209, 210, 211, 821, 359/385, 391

[56] References Cited
U.S. PATENT DOCUMENTS
4,844,568  7/1989  Suzuki et al. ................. 359/209

FOREIGN PATENT DOCUMENTS
62-163  1/1987  Japan .

Primary Examiner—Loha Ben
Attorney, Agent, or Firm—Wenderoth, Lind & Ponack

[57] ABSTRACT

A projecting and exposing device includes a light source and a device for projecting light emitted by the light source to a mask. At least one inverting or erect projecting optical system is provided for projecting an area of a part of the pattern of the mask onto a substrate in the ratio of N to 1. A scanning device moves the projecting optical system in a speed ratio of N:1 so as to scan the mask and expose the substrate to the light coming from a pattern of the mask. A device also moves the mask and the substrate in the speed ratio of N:1.

15 Claims, 8 Drawing Sheets

PROJECTING AND EXPOSING DEVICE

BACKGROUND OF THE INVENTION

The present invention relates to a projecting and exposing device to be used for manufacturing the substrate of a semiconductor, a liquid crystal display device or the like.

Referring to FIGS. 8 and 9, the construction of a conventional projecting and exposing device disclosed in Japanese Patent Laid-Open Publication No. 62-163 is described below.

A condensing optical system 1 comprises a light source 2 and an elliptic mirror 3. Light emitted by the light source 2 is condensed on the entrance of a bundled optical fiber 5. In an illuminating optical system 4, light which has left the bundled optical fiber 5, branching off to a plurality of optical fibers 6 passes through a condenser lens 7 and is projected onto a mask 8 in a spot configuration. The light which has passed through the mask 8 forms the image of a part of the pattern of the mask 8 on a substrate 10 through a 1:1-erect projecting optical system 9 consisting of a plurality of lenses. The condensing optical system 1, the illuminating optical system 4, and the 1:1 erect projecting optical system 9 are supported by a fixture 13 and rotary casings 11 and 12, so that the above three systems 1, 4, and 9 rotate simultaneously about a rotational shaft 14 by a motor 15. The mask 8 and the substrate 10 are supported by a carriage 16, and linearly scanned in the direction shown by the arrow C of FIG. 9. Thus, the pattern of the mask 8 is projected onto the entire surface of the substrate 10 such that the ratio of the area of the pattern to that of the image is 1 to 1.

However, the above construction requires many lenses in order to compose the erect projecting optical system, generating a small amount of aberration, and in addition, the entire device is long.

As described above, according to the projecting and exposing device, the ratio of the area of the mask pattern to the area of the mask pattern protected onto the substrate is equal to one to one. It is necessary to perform a minified or magnified projection onto a substrate for use in a semiconductor or a liquid crystal display device. With the above mask, it is difficult to form a very fine pattern on the substrate or expose the entire surface of the large area substrate to light. Therefore, the above device cannot be used for forming a very large scale integration (VLSI) on the substrate or exposing a large area substrate of a liquid crystal device.

SUMMARY OF THE INVENTION

Accordingly, an essential object of the present invention is to provide a projecting and exposing device capable of carrying out a minified or magnified projection, being short in its entire optical system, comprising a small number of lenses, and having a high resolution so as to be applicable for manufacturing a VLSI or a large-sized liquid crystal panel.

In accomplishing these and other objects, according to the present invention, there is provided a projecting and exposing device comprising; a light source, means for projecting light emitted by the light source to a mask, at least one inverting or erect projecting optical system for projecting an area of a part of the pattern of the mask onto a substrate in the ratio of N to 1, scanning means for moving the projecting optical system in a speed ratio of N:1 so as to scan the mask and expose the substrate to the light coming from a pattern of the mask, and means for moving the mask and the substrate in the speed ratio of N:1.

According to the above construction, the scanning means moves the N:1-inversion optical system so as to scan the mask and the substrate, and the moving means moves the mask and the substrate in the speed ratio of N to one in the directions opposite or identical to each other. According to the above construction, the substrate is exposed to light coming from the pattern of the mask with the area of the pattern of the mask magnified or minified.

Since the rotary N:1-reduced inversion optical system is used, the projecting optical system can be composed of a small number of compact lenses. Accordingly, a compact projecting optical system can be constructed. Since a large visual field is not required, a lens of a high resolving power having a large NA can be used. Therefore, a very fine pattern can be easily formed on the substrate. Further, the light coming from the mask pattern is magnifiably projected onto the substrate such that the area of the projected image is much greater than that of a lens.

The mask pattern can be projected onto a substrate in a magnified, equal, reduced size by varying the structure and arrangement of the optical components of the projecting optical system.

BRIEF DESCRIPTION OF THE DRAWINGS

These and other objects and features of the present invention will become apparent from the following description taken in conjunction with the preferred embodiments thereof with reference to the accompanying drawings, in which.

DETAILED DESCRIPTION OF THE INVENTION

Figure 1:
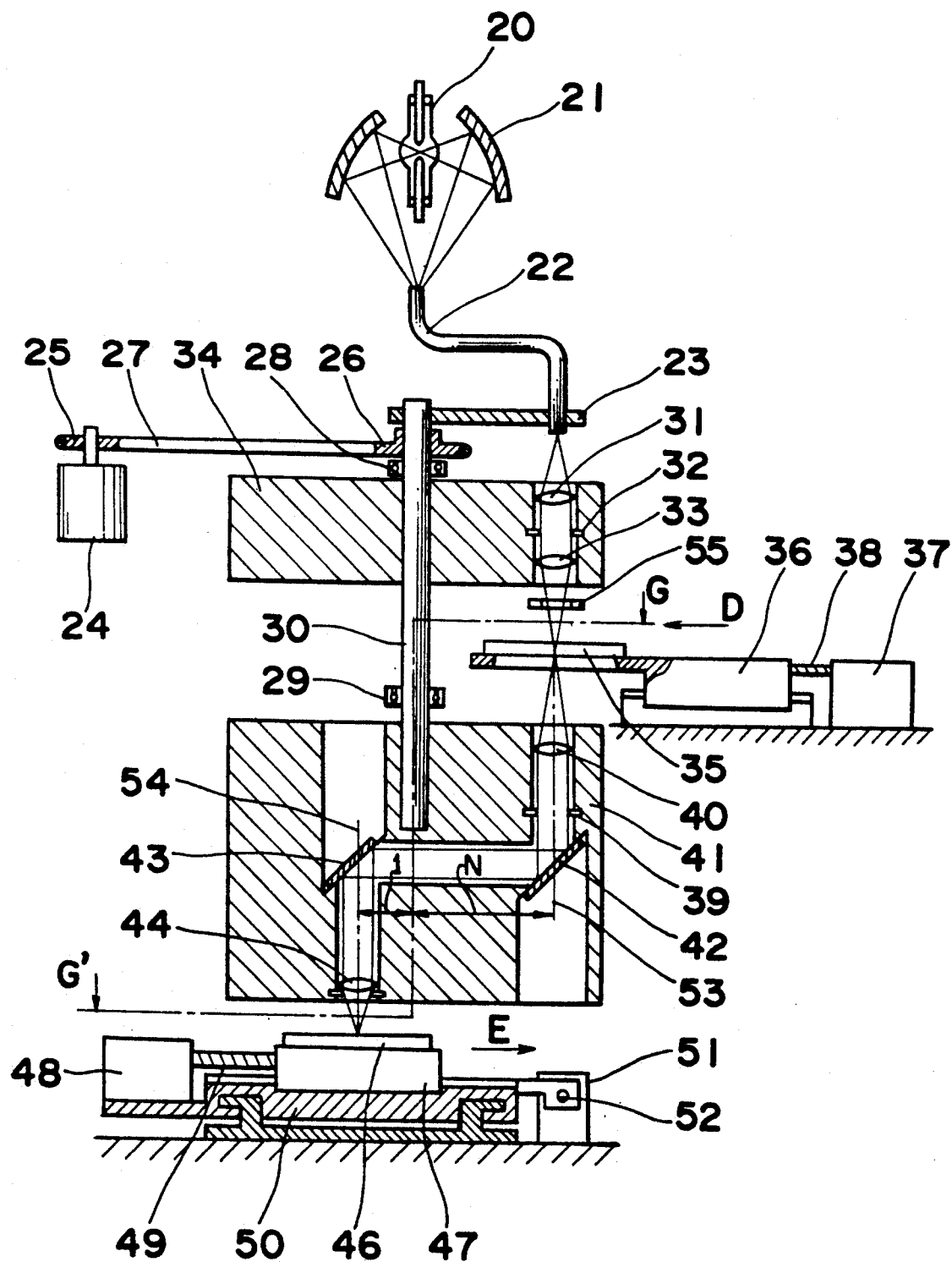
FIG. 1 is a longitudinal sectional view showing a projecting and exposing device in accordance with a first embodiment of the present invention.

Before the description of the present invention proceeds, it is to be noted that like parts are designated by like reference numerals throughout the accompanying drawings.

Figure 2:
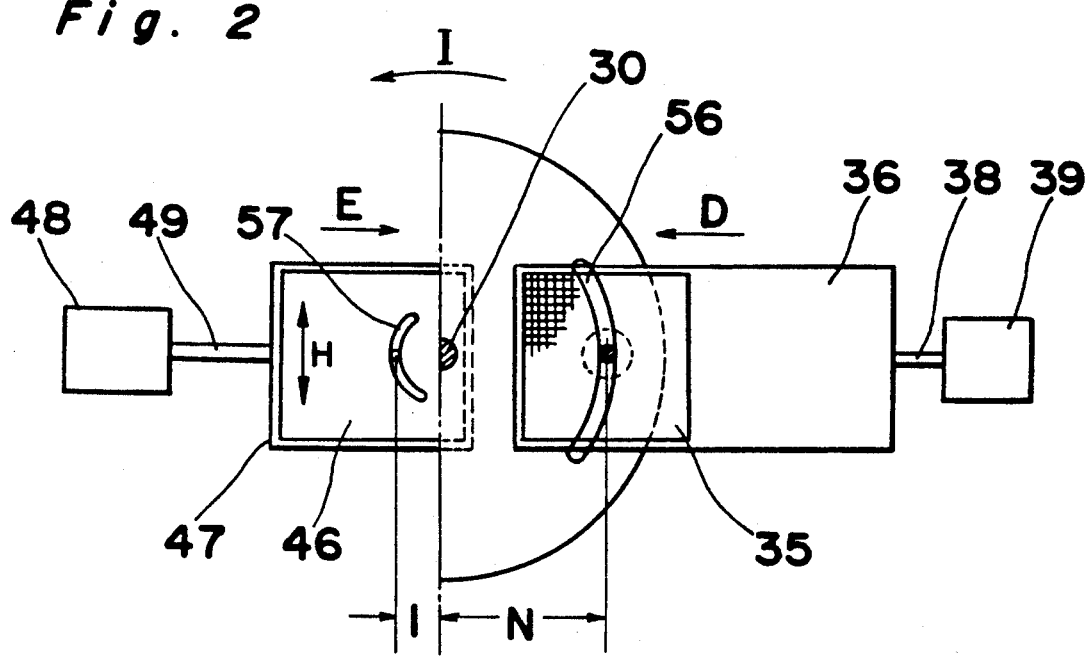
FIG. 2 is a sectional view taken along line G-G' of FIG. 1.

FIG. 1 through FIG. 3 show a rotation scanning type projecting and exposing device according to a first embodiment of the present invention.

Referring to FIG. 1, the device comprises a mercury-vapor lamp 20 serving as a light source, a heat ray transmission type elliptic reflecting mirror 21, and bundled optical fiber 22. A fixture 23 fixes the bundled optical fiber 22. An auxiliary condenser lens 31, an aperture diaphragm 32, and a condenser lens 33 are on a first rotary casing 34. An aperture diaphragm 39, reducing projection lenses 40 and 44, and reflecting mirrors 42 and 43 are on a second rotary casing 41. A stage 36 for holding a mask 35 is driven by a motor 37 and a ball thread 38 in the direction shown by an arrow D. A stage 47 for holding a substrate 46 is driven by a motor 48 and a ball thread 49 in the direction shown by an arrow E. A stage 50, perpendicular to the stage 47, is driven in the direction shown by an arrow H of FIG. 2 by a motor 51 and a ball thread 52. A rotary shaft 30, for integrally holding the first rotary casing 34, the second rotary casing 41, and the fixture 23, is driven by a driving motor 24, a small pulley 25, a large pulley 26, and a belt 27. Bearing 28 and 29 support the rotary shaft 30.

The light coming from the pattern of the mask 35 is projected, through the reducing projection lenses 40 and 44, onto the substrate 46 as a minified inverted image in the ratio of N to 1 (N≧1). The ratio of the distance between the optical axis 53 of the reducing projection lens 40 and the shaft 30 to the distance between the optical axis 54 of the reducing projection lens 44 and the shaft 30 is N to 1 (N≧1).

The operation of the rotary scanning type projecting and exposing device of the above construction will be described below.

Light emitted by the mercury-vapor lamp 20 is reflected, condensed by the elliptic reflecting mirror 21, and then incident into the end of the bundled optical fiber 22. Light passes through the bundled optical fiber 22, the auxiliary condenser lens 31, and the condenser lens 33, thus forming a spot on the lower surface of the mask 35. FIG. 2 shows the spot formed on the surface of the mask pattern and a spot formed on the substrate 46. According to the first embodiment, the diameter of the spot formed on the mask pattern is 8 mm. Light of the image of the mask pattern in the 8 mm-diameter spot range passes through an N:1-reduced inversion optical system comprising the lens 40, the reflecting mirrors 42 and 43, and the reducing projection lens 44, thus forming the image of a part of the pattern of the mask 35 on the upper surface of the substrate 46. According to the first embodiment, N=4. Therefore, the spot is formed on the mask 35 in the diameter of 8 mm while the spot is formed on the substrate 46 in a reduced diameter of 2 mm, namely, one fourth of 8 mm.

Figure 3A:
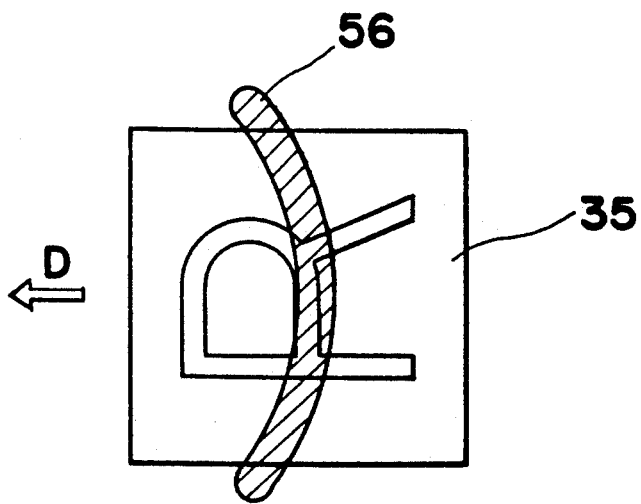
FIGS. 3a and 3b are illustrations showing the range in which a mask and a substrate are illuminated and scanned.
Figure 3B:
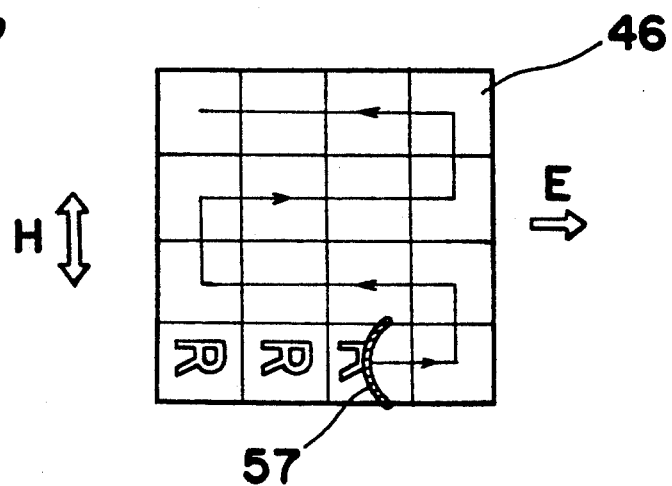

The motor 24 rotates the optical fiber bundle 22, the first rotary casing 34, and the second rotary casing 41 simultaneously. Therefore, each of the loci of the spots formed on the mask 35 and the substrate 46 is circular. The range in which the substrate 46 is exposed is limited by a fixed slit diaphragm 55 of a circular arc with the illuminance of the substrate 46 uniform thereon. Therefore, per rotation of the rotary members, the pattern of the mask 35 is scanned in the range as shown by reference numeral 56 of FIG. 2 while the substrate 46 is exposed to the light coming from the mask 35 as shown by reference numeral 57 of FIG. 2. As shown in FIG. 2, the mask 35 is scanned while it is being linearly moved by the motor 37 in the direction shown by the arrow D, and the substrate 46 is exposed to the light coming from the mask 35 while it is being linearly moved by the motor 48 in the direction shown by the arrow E. During the movements of the mask 35 and the substrate 46, the speeds thereof are precisely controlled by a servo driving device comprising a laser length measuring device not shown so that the ratio of the movement speed of the mask 35 to that of the substrate 46 is N to 1. According to the first embodiment, the ratio is four to one. Accordingly, due to the scanning performed by the motions of the rotary members and the linear movement of the mask 35 and the substrate 46, the mask pattern is projected onto the substrate 46 with the area thereof reduced to one fourth as shown in FIGS. 3a and 3b.

The projecting and exposing device according to the first embodiment comprises a H-direction stage 50, perpendicular to the E-direction stage 47, serving as the means for linearly moving the substrate 46. Therefore, the substrate 46 is sequentially exposed to the light coming from the mask 35. As a result, the substrate 46 is sequentially exposed to lights coming from a plurality of mask patterns in the predetermined reduced area as shown in FIG. 3b. While the substrate 46 is being exposed to light, the mask 35 and the substrate 46 move in directions D and E opposite to each other. Light coming from the mask 35 forms an inverted image on the substrate 46 as shown in FIGS. 3a and 3b.

When an exposure is carried out, the spot illuminating optical system forms an 8 mm-diameter spot on the mask 35. Supposing that the moving speed of the mask 35 in the direction D is 20 mm/sec and that the shaft 30 rotates at 12,000 rpm, scanning of the 8 mm-length is performed 50 times by the motion of the rotary members and the linear movement of the mask 35. Illuminance nonuniformity occurs at a percentage of not more than 2 in the circular arc scanning.

As described above, the projecting and exposing device according to the first embodiment comprises the following optical systems: the rotary spot illuminating optical system; the N:1-reduced inversion projecting optical system, provided coaxially with the spot illuminating optical system, comprising the entrance side, namely, mask side, the optical axis 53 of which is concentric with the spot illuminating optical system, and the exit side, namely, the substrate side, the optical axis 54 of which is parallel with the optical axis 53 and the radius of which is one Nth of the radius of the optical axis 53; and the two moving means for linearly moving the mask 35 and the substrate 46, respectively in the directions opposite to each other. According to the above construction, the substrate 46 is exposed to light traveling from the mask 35. Consequently, the following advantages can be obtained.

1. Since the rotary N:1-reduced inversion optical system is used, the projecting optical system can be composed of a small number of compact lenses. Accordingly, a compact projecting optical system can be constructed.

2. Since a large visual field is not required, a lens of a high resolving power having a large NA can be used.

Therefore, the substrate can be easily exposed to lights coming from a very fine pattern such as a VLSI.

3. Since the mask pattern is projected on the substrate with the area thereof minified, a very fine pattern such as a VLSI can be formed on the substrate of a magnified pattern. Therefore, manufacturing of the mask is facilitated and manufacturing cost thereof is low.

Figure 4:
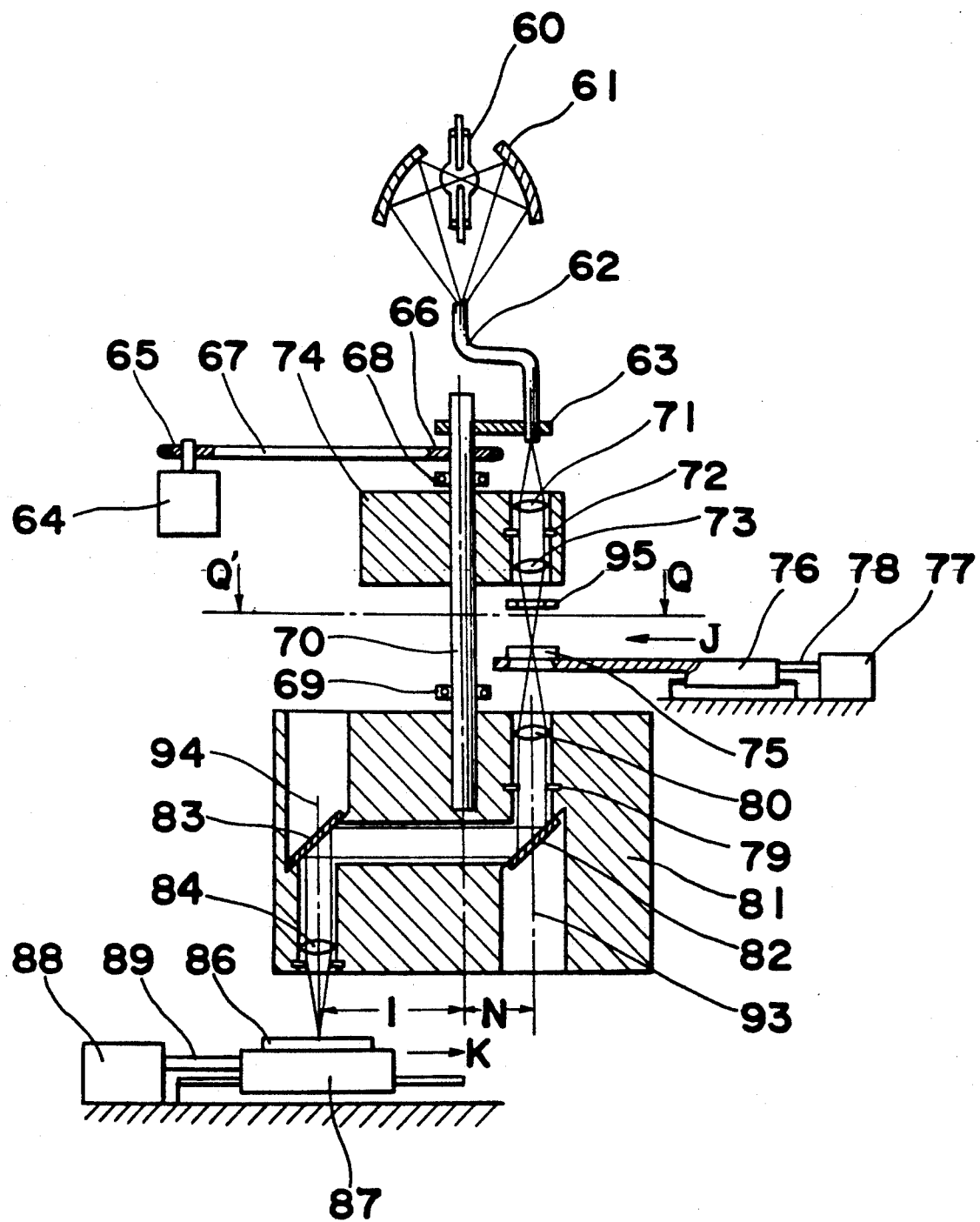
FIG. 4 is a longitudinal sectional view showing a projecting and exposing device in accordance with a second embodiment of the present invention.
Figure 5:
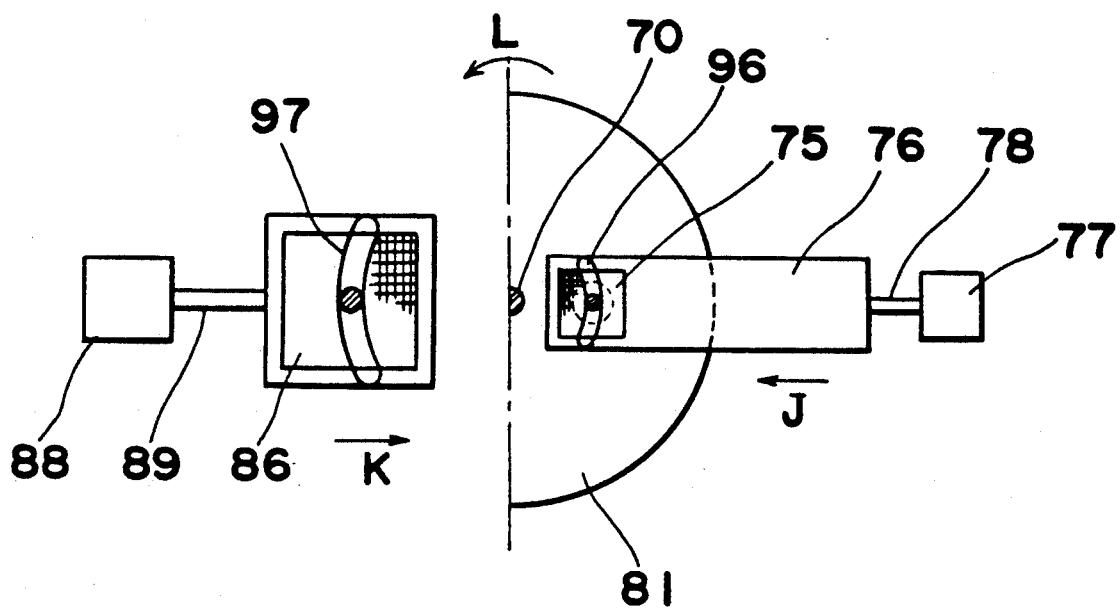
FIG. 5 is a sectional view taken along line Q-Q' of FIG. 4.

Referring to FIGS. 4 and 5 a projecting and exposing device according to a second embodiment will be described below.

Referring to FIG. 4, the device comprises a mercury-vapor lamp 60 serving as the light source, a heat ray transmission type elliptic reflecting mirror 61, and a bundled optical fiber 62. A fixture 63 for fixes the bundled optical fiber 62. An auxiliary condenser lens 71, an aperture diaphragm 72; a condenser lens 73; a first rotary casing 74. An aperture diaphragm 79; magnifying projection lenses 80 and 84, and reflecting mirrors 82 and 83 are on a second rotary casing 81. A stage 76 for holding a mask 75 is driven by a motor 77 and a ball thread 78 in the direction shown by the arrow J of FIG. 5. A stage 87 for holding the substrate 86, driven by a motor 88 and a ball thread 89 in the direction shown by the arrow K of FIG. 5. A shaft 70 for integrally holding the first rotary casing 74, the second rotary casing 81, and the fixture 63 is driven by a motor 64, a small pulley 65, a large pulley 66, and a belt bearings 68 and 69 support the shaft 70.

Light coming from the pattern of the mask 75 is projected, through the magnifying projection lenses 80 and 84, onto the substrate 86 as a magnified inverted image in the ratio of N to 1 (N≦1). The ratio of the distance between the optical axis 93 of the magnifying projection lens 80 and the shaft 70 to the distance between the optical axis 94 of the magnifying projection lens 84 and the shaft 70 is N to 1 (N≦1).

The operation of the rotary scanning type projecting and exposing device of the above construction will be described below.

Light emitted by the mercury-vapor lamp 60 is reflected, condensed by the elliptic reflecting mirror 61, and then incident into the end of the bundled optical fiber 62. Light passes through the bundled optical fiber 62, the auxiliary condenser lens 71, and the condenser lens 73, thus forming a spot on the lower surface of the mask 75. FIG. 5 shows the spot formed on the surface of the mask pattern and a spot formed on the substrate 86. According to the second embodiment, the diameter of the spot formed on the mask pattern is 4 mm. Light of the image of the mask pattern in the range of 4 mm-diameter passes through the N:1-magnified inversion optical system comprising of the lens 80, the reflecting mirrors 82 and 83, and the magnifying projection lens 84, thus forming the image of a part of the pattern of the mask 75 on the upper surface of the substrate 86. According to the second embodiment, N=0.5. Therefore, the diameter of the spot formed on the mask 75 is 4 mm while the diameter of the spot formed on the substrate 86 is 8 mm, namely, two times 4 mm.

The motor 64 rotates the optical fiber bundle 62, the first rotary casing 74, and the second rotary casing 81 simultaneously. Therefore, each of the loci of the spots formed on the mask 75 and the substrate 86 is circular. The range in which the substrate 86 is exposed is limited by a fixed slit diaphragm 95 of a circular arc. Therefore, per rotation of the rotary members, the pattern of the mask 75 is scanned in the range shown by reference numeral 96 shown in FIG. 5 while the substrate 86 is exposed to the light coming from the mask 75 as shown by reference numeral 97 of FIG. 5. As shown in FIG. 5, the mask 75 is scanned while it is being linearly moved in the direction shown by the arrow J, and the substrate 86 is exposed to light in the opposite direction of K of FIG. 5 while it is being linearly moved. During the movement of the mask 75 and the substrate 86, the speeds thereof are precisely controlled by a laser length measuring device (not shown) so that the ratio of the movement speed of the mask 75 to that of the substrate 86 is N to 1. According to the second embodiment, the ratio is 0.5 to 1. Accordingly, due to the scanning performed by the motion of the rotary members and the linear movement of the mask 75 and the substrate 86, the pattern of the mask 75 is magnified to two times onto the substrate 86 as shown in FIG. 5. Similarly to the first embodiment, the image of the mask pattern is inverted on the substrate 86.

When an exposure is carried out, the spot illuminating optical system forms a 4 mm-diameter spot on the mask 75. Supposing that the moving speed of the mask 75 in the direction J is 10 mm/sec and that the shaft 70 rotates at 12,000 rpm, scanning of the 4 mm-length is performed 50 times by the motion of the rotary members and the linear movement of the mask 75. Illuminance nonuniformity occurs at the percentage of not more than 2 in the circular arc scanning.

As described above, the projecting and exposing device according to the second embodiment comprises the following optical systems: the rotary spot illuminating optical system; the N:1-magnified inversion projecting optical system, provided coaxially with the spot illuminating optical system, comprising the entrance side (mask side), the optical axis 93 of which is concentric with that of the spot illuminating optical system and the exit side (substrate side), the optical axis 94 of which is parallel with the optical axis 93 of the entrance side and the radius of which is one Nth of the radius of the optical axis 93 of the entrance side; and the two moving means for linearly moving the mask 75 and the substrate 86, respectively, in the directions opposite to each other. According to the above construction, the mask pattern is scanned to expose the substrate 86 to light coming from the mask 75. Consequently, the following advantages can be obtained.

1. Since the rotary N:1-magnified inversion optical system is used, the projecting optical system can be composed of a small number of compact lenses. Accordingly, a compact projecting optical system can be constructed.

2. Since a large visual field is not required, a lens of a high resolving power having a large NA can be used.

3. Since the mask pattern is magnifiably projected onto the substrate, a large-sized substrate such as a liquid crystal panel can be formed on the substrate via a small-sized mask which can be manufactured easily and at a low cost. Further, the mask can be retained in a plane with a high accuracy.

Figure 7:
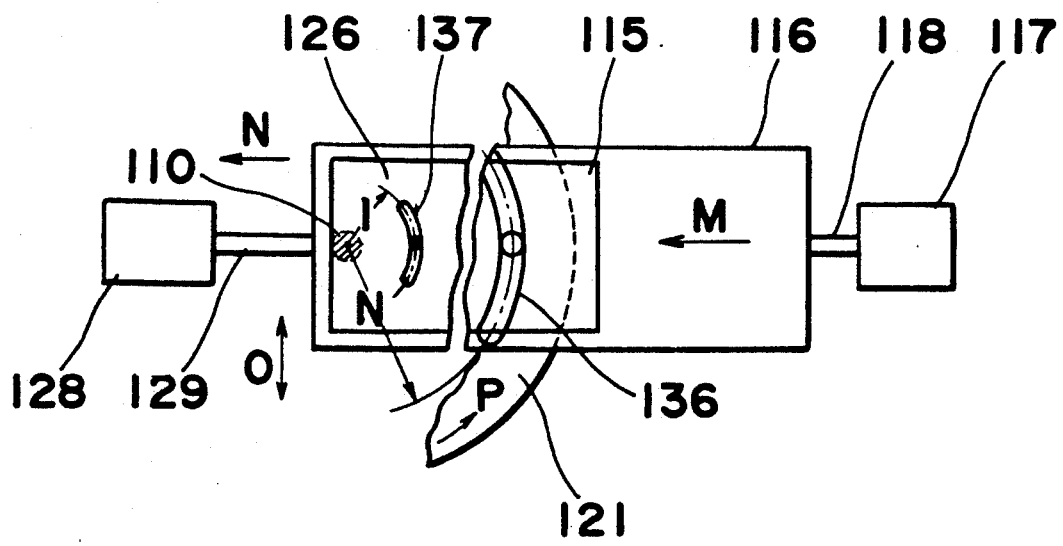
FIG. 7 is a sectional view, partly broken away, taken along the line R-R' of FIG. 6.
Figure 6:
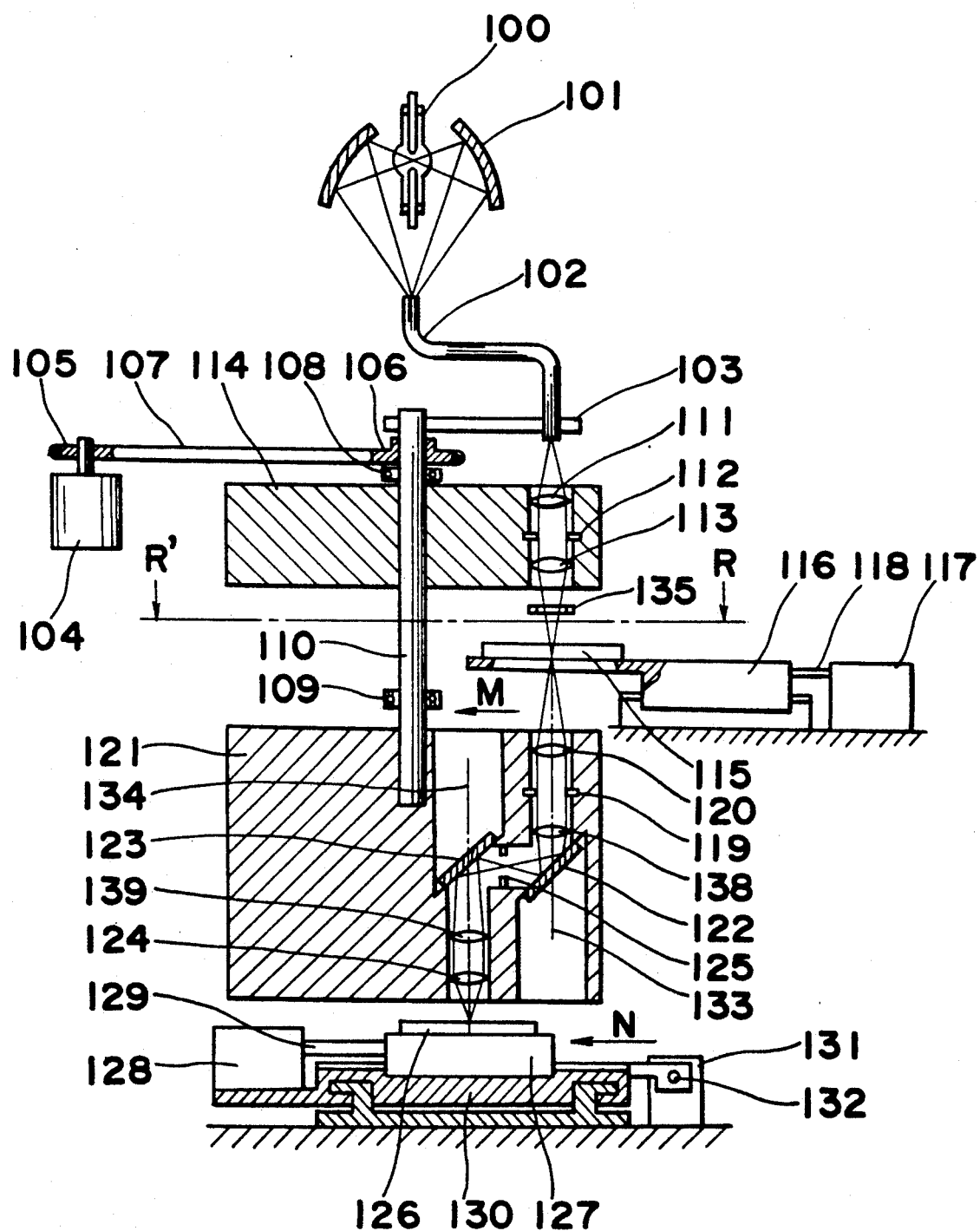
FIG. 6 is a longitudinal sectional view showing a projecting and exposing device in accordance with a third embodiment of the present invention.
Figure 8:
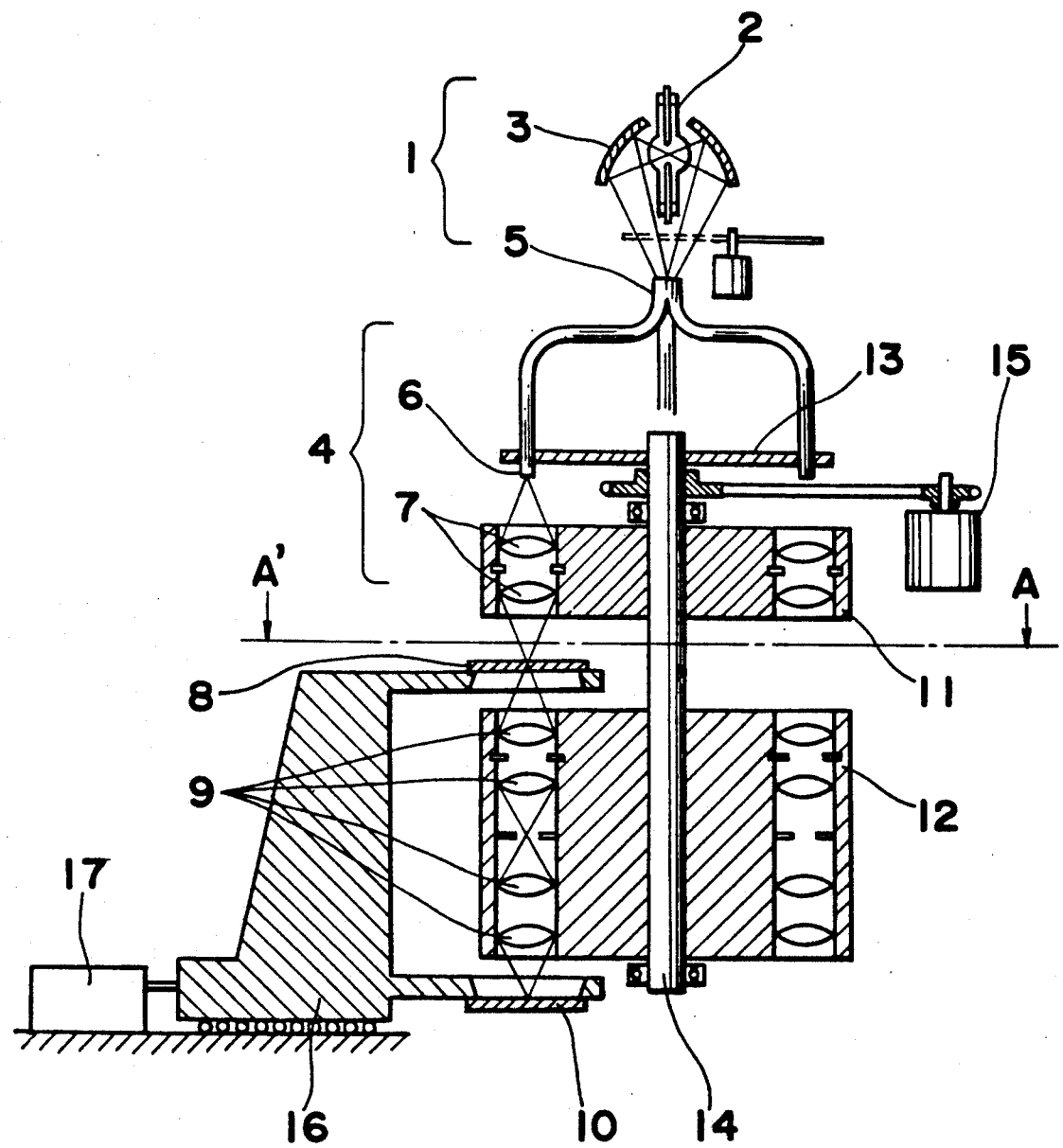
FIG. 8 is a longitudinal sectional view showing an example of a conventional a rotary scanning type projecting and exposing device.
Figure 9:
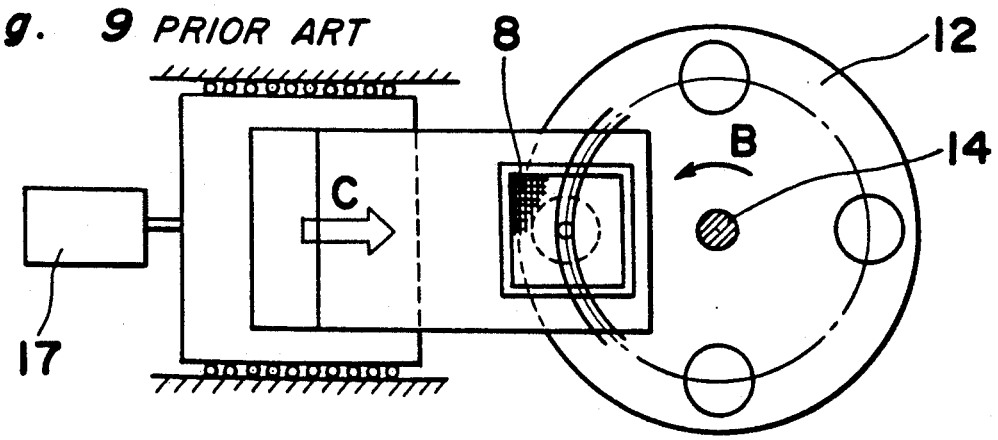
FIG. 9 is a sectional view taken along line A-A' of FIG. 8.

Referring to FIGS. 6 and 7, a projecting and exposing device according to a third embodiment will be described below.

Referring to FIG. 6, the device comprises a mercury-vapor lamp 100 serving as a light source, a heat ray transmission type elliptic reflecting mirror 101, and a bundled optical fiber 102. A fixture 103 fixes the bundled optical fiber 102. An auxiliary condenser lens 111; an aperture diaphragm 112, and a condenser lens 113 are on a first rotary casing 114. An aperture diaphragm 119, erect projection lenses 120, 124, 138, and 139, a field stop 125 and reflecting mirrors 122 and 123 are on a second rotary casing 121. A stage 116 for holding the mask 115 is driven by a motor 117 and a ball thread 118 in the direction shown by the arrow M. A stage 127 for holding a substrate 126 is driven by a motor 128 and a ball thread 129 in the direction shown by the arrow N.

A stage 130, perpendicular to the stage 127, is driven in the direction shown by the arrow O of FIG. 7 by a motor 131 and a ball thread 132. A shaft 110, for integrally holding the first rotary casing 114, the second rotary casing 121, and the fixture 103, is driven by a driving motor 104, a small pulley 105, a large pulley 106, and a belt 107. Bearings 108 and 109 support the shaft 110.

The pattern of the mask 115 is projected, through the erect projection lenses 120, 124, 138, and 139, on the substrate 126 as a minified erect image in the ratio of N to 1 ($N \geq 1$). The ratio of the distance between the optical axis 133 of the erect projection lens 120 and the shaft 110 to the distance between the optical axis 134 of the erect projection lens 124 and the shaft 110 is N to 1 ($N \geq 1$).

The operation of the rotary scanning type projecting and exposing device of the above construction will be described below.

Light emitted by the mercury-vapor lamp 100 is reflected, condensed by the elliptic reflecting mirror 101, and then incident into the end of the bundled optical fiber 102. The light passes through the bundled optical fiber 102, the auxiliary condenser lens 111, and the condenser lens 113, thus forming a spot on the lower surface of the mask 115. FIG. 7 shows the spot formed on the surface of the mask pattern and a spot formed on the substrate 126. According to the third embodiment, the diameter of the spot formed on the mask pattern is 8 mm. The light of the image of the mask pattern in the range of 8 mm-diameter passes through the N:1-reduced erect optical system comprising the lenses 120 and 138, the reflecting mirrors 122 and 123, and the lenses 124 and 139, thus forming the image of a part of the pattern of the mask 115 on the upper surface of the substrate 126. According to the third embodiment, N=4. Therefore, the spot is formed on the mask 115 in the diameter of 8 mm while the spot is formed on the substrate 126 in the reduced diameter of 2 mm, namely, one fourth of 8 mm.

The motor 104 rotates the optical fiber bundle 102, the first rotary casing 114, and the second rotary casing 121 simultaneously. Therefore, each of the loci of the spots formed on the mask 115 and the substrate 126 is circular. The range in which the substrate 126 is exposed is limited by a fixed slit diaphragm 135 of a circular arc. Therefore, per rotation of the rotary members, the pattern of the mask 115 is scanned in the range shown by reference numeral 136 shown in FIG. 7 while the substrate 126 is exposed as shown by reference numeral 137. As shown in FIG. 7, the mask 115 is scanned while it is being linearly moved by the motor 117 in the direction shown by the arrow M, and the substrate 126 is exposed to light while it is being linearly moved by the motor 128 in the same direction as shown by the arrow N. During the movement of the mask 115 and the substrate 126, the speeds thereof are precisely controlled by a laser length measuring device (not shown) so that the ratio of the movement speed of the mask 115 to that of the substrate 126 is N:1. According to the third embodiment, N:1 is four to one. Accordingly, due to the scanning performed by the rotary movements of the rotary members and the linear movement of the mask 115 and the substrate 126, the light coming from the mask pattern is projected onto the substrate 126 with the area thereof reduced to one fourth, as shown in FIG. 7.

The projecting and exposing device according to the third embodiment comprises the O-direction stage 130, perpendicular to the N-direction stage 127, serving as the means for linearly moving the substrate 126. Therefore, similarly to the first embodiment, the substrate 126 is sequentially exposed to light coming from the mask 115. As a result, the substrate 126 is sequentially exposed to lights coming from a plurality of mask patterns in the predetermined reduced area. While an exposure is being carried out, the mask 115 and the substrate 126 move in directions M and N identical to each other.

When an exposure is carried out, the spot illuminating optical system forms an 8 mm-diameter spot on the mask 115. Supposing that the moving speed of the mask 115 in the direction M is 20mm/sec and that the shaft 110 rotates at 12,000 rpm, scanning of the 8 mm-length is performed 50 times by the motion of the rotary members and the linear movement of the mask 115. Illuminance nonuniformity occurs at a percentage of not more than 2 in the circular arc scanning.

The projecting and exposing device according to the third embodiment comprises: the rotary spot illuminating optical system; the N:1-reduced erect projecting optical system, provided coaxially with the spot illuminating optical system, comprising the entrance side, namely, the mask side, the optical axis 133 of which is concentric with that of the spot illuminating optical system and the exit side, namely, substrate side, the optical axis 134 of which is parallel with the optical axis 133 of the entrance side and the radius of which is one Nth of the radius of the optical axis 133 of the entrance side; and the two moving means for linearly moving the mask 115 and the substrate 126 in the same direction. According to the above construction, the substrate 126 is exposed to light traveling from the mask 115. Consequently, the following advantages can be obtained.

1. Since a large visual field is not required, a lens of a high resolving power having a large NA can be used.

2. Since light coming from the mask pattern is projected on the substrate with the area thereof reduced, a very fine pattern such as a VLSI can be formed on the substrate of a magnified pattern. Therefore, manufacturing of the mask is facilitated the manufacturing cost thereof is low.

Two modifications of the present invention will be described below.

Figure 10:
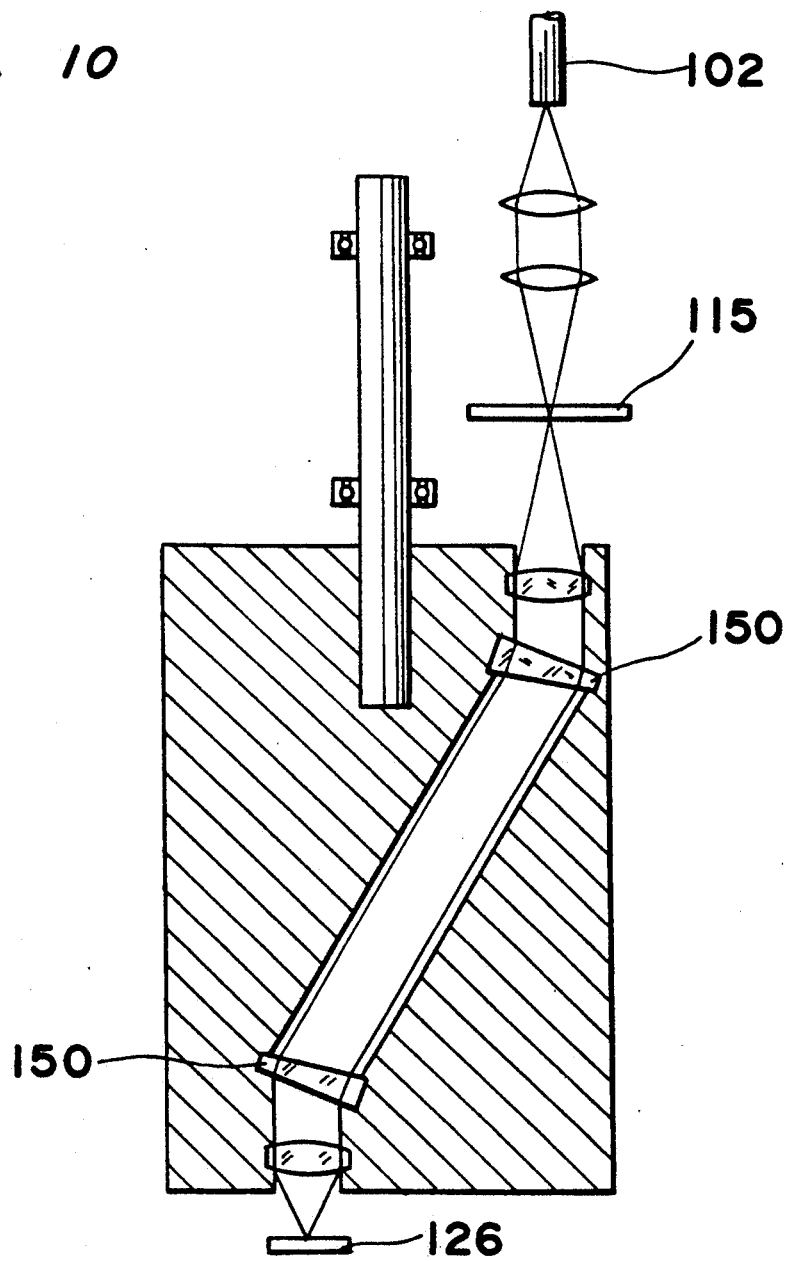
FIGS. 10 and 11 are explanatory views showing modifications of the present invention.
Figure 11:
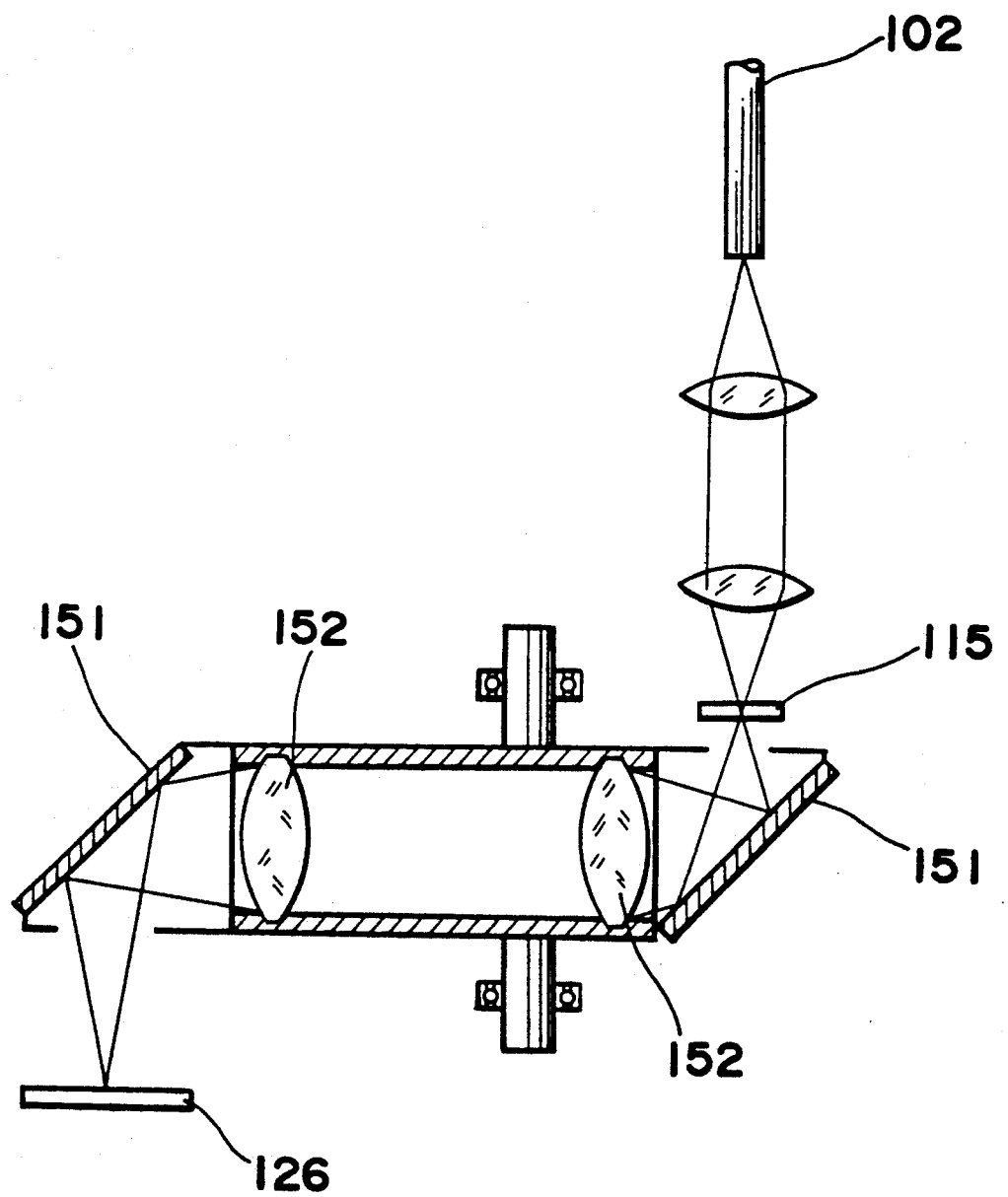

FIGS. 10 and 11 show only the projecting optical system (second rotary casing) of a modification of the present invention. The structures of the other portions are similar to those of the first, second, and third embodiments.

The projecting optical system shown in FIG. 10 comprising a prism 150 and an inclined optical axis has the same effect as the above-described embodiments.

Referring to FIG. 11, light which has passed through a mask 115 is reflected by mirrors 151 and passes through lenses 152, thus forming an image on a substrate 126. The effect obtained by this construction is the same as those of the above-described embodiments.

As described above, each of the projecting optical systems of the above-described embodiments comprises the refracting optical system using lenses. A similar effect can be obtained by changing the number of lenses or the arrangement of the above-described embodiments. A similar effect can also be obtained by a reflecting optical system using a mirror or by a projecting optical system comprising cata optoric optical system using other optical components. It is essential that lights emitted by a light source are condensed on a substrate with a mask pattern minified or magnified.

The effect obtained by the optical system, of the above embodiments, comprising the optical axis parallel or perpendicular to the shaft can be obtained by an optical system comprising an optical axis inclined with respect to the shaft. It is essential that the ratio of the distance between the optical axis of the mask pattern and the shaft to the distance between the optical axis of the substrate and the shaft is N to 1 ($N \geq 1$).

The effect obtained by the construction, of the above embodiments, comprising the first rotary casing and the second rotary casing mechanically connected with each other to be rotated together by one driving means is similar to the effect obtained by driving them separately such that the operations thereof can be electrically synchronized with each other.

The effect obtained by using a light source such as laser beam, electron beam or X-rays is identical to the effect obtained by using the mercury-vapor lamp used in the above embodiments.

In the above embodiments, the optical system such as the optical fiber and lenses are rotated to scan the pattern of the mask, and the mask and the substrate are linearly moved to expose the substrate to light. But the same effect can be obtained by fixing the optical system and moving the mask and the substrate. It is essential that the substrate is exposed to light coming from the mask with the area or size of the mask pattern reduced or magnified.

According to the first and third embodiments, light coming from the pattern of the mask is projected onto the substrate with the area thereof reduced in the ratio of four to one while according to the second embodiment, the light coming from the former is projected onto the latter with the area thereof magnified from one to two. The ratio of the linear moving speed of the mask to that of the substrate is four to one in the first and third embodiments while according to the second embodiment, the ratio of the former to the latter is one to two. But the same effect can be obtained by changing these ratios. For example, light coming from the mask pattern can be projected onto the substrate with the area thereof magnified in the third embodiment by replacing the inversion optical system of the second embodiment with the erect optical system, which means that this modification is included within the scope of the present invention.

A plurality of the N:1-projecting optical systems, the masks, and the substrates can be used to obtain a more effective exposing operation.

As is apparent from the foregoing description, the projecting and exposing device of the present invention can be miniaturized with a small number of compact optical components. That is, a short projecting optical system can be obtained. Since a large visual field is not required, a very fine pattern can be easily formed on a substrate using a lens of a high resolving power having a large NA.

Furthermore, a mask pattern can be projected onto the substrate in a magnified, equal, reduced size by varying the structure and arrangement of the optical components of the projecting optical system. Therefore, a very fine pattern such as an LSI can be formed easily and promptly by entirely exposing a large-sized substrate at a time using a compact mask or projecting light of the image of the mask pattern stepwise onto the substrate by reducing the area thereof.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A projecting and exposing device, comprising:
   a light source;
   means for projecting light emitted by the light source to a mask;
   at least one inverting optical system for projecting an area of a part of a pattern of the mask onto a substrate in a ratio of N to 1, wherein $N \neq 1$;
   scanning means for moving said optical system so as to scan the mask and expose the substrate to light coming from the pattern of the mask in a speed ratio of said ratio of N to 1, wherein $N \neq 1$; and
   means for moving the mask and the substrate relative to each other in said speed ratio of N to 1, $N \neq 1$.

2. The projecting and exposing device of claim 1, wherein said scanning means comprises a rotary motion system having a rotary axis, said optical system having a mask optical axis and a substrate optical axis, and the ratio of the distance between said mask optical axis to said rotary axis to the distance between said substrate optical axis and said rotary axis being said ratio of N to 1.

3. The projecting and exposing device of claim 1, wherein $N > 1$.

4. The projecting and exposing device of claim 1, wherein $N < 1$.

5. The projecting and exposing device of claim 1, wherein said means for moving the mask and the substrate comprises a first stage for holding the mask, a first motor mechanism for moving said first stage, a second stage for holding the substrate and a second motor mechanism for moving the second stage.

6. The projecting and exposing device of claim 5, wherein each of said motor mechanisms comprises a motor and a ball screw.

7. The projecting and exposing device of claim 5, wherein said second motor mechanism of said means for moving can move the substrate both parallel and perpendicular to the direction of movement of the mask.

8. A projecting and exposing device, comprising:
   a light source;
   means for projecting light emitted by the light source to a mask;
   at least one erect projecting optical system for projecting an area of a part of a pattern of the mask onto a substrate in a ratio of N to 1, wherein $N \neq 1$;
   scanning means for moving said optical system so as to scan the mask and expose the substrate to light coming from the pattern of the mask in a speed ratio of said ratio of N to 1, wherein $N \neq 1$; and
   means for moving the mask and the substrate relative to each other in the speed ratio of N to 1, $N \neq 1$.

9. The projecting and exposing device of claim 8, wherein said scanning means comprises a rotary motion system having a rotary axis, said optical system having a mask optical axis and a substrate optical axis, and the ratio of the distance between said mask optical axis to said rotary axis to the distance between said substrate optical axis and said rotary axis being said ratio of N to 1.

10. The projecting and exposing device of claim 8, wherein N>1.

11. The projecting and exposing device of claim 8, wherein said means for moving the mask and the substrate comprises a first stage for holding the mask, a first motor mechanism for moving said first stage, a second stage for holding the substrate and a second motor mechanism for moving the second stage.

12. The projecting and exposing device of claim 11, wherein each of said motor mechanisms comprises a motor and a ball screw.

13. The projecting and exposing device of claim 11, wherein said second motor mechanism of said means for moving can move the substrate both parallel and perpendicular to the direction of movement of the mask.

14. A projecting and exposing device, comprising:
a light source;
means for projecting light emitted by the light source to a mask;
at least one optical system for projecting an area of a part of a pattern of the mask onto a substrate in a predetermined ratio;
scanning means for moving said optical system so as to scan the mask and expose the substrate to light coming from the pattern of the mask in a speed ratio of said predetermined ratio; and
means for moving the mask and the substrate relative to each other in the speed ratio, said means comprising a first motor mechanism for moving the mask and a second motor mechanism for moving the substrate.

15. The projecting and exposing device of claim 14, wherein said scanning means comprises a rotary motion system having a rotary axis, said optical system having a mask optical axis and a substrate optical axis, and the ratio of the distance between said mask optical axis to said rotary axis to the distance between said substrate optical axis and said rotary axis being the predetermined speed ratio.

* * * * *